(12) United States Patent
Cobbley et al.

(10) Patent No.: US 6,268,275 B1
(45) Date of Patent: Jul. 31, 2001

(54) METHOD OF LOCATING CONDUCTIVE SPHERES UTILIZING SCREEN AND HOPPER OF SOLDER BALLS

(75) Inventors: Chad A. Cobbley; Michael B. Ball; Marjorie L. Waddel, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/168,621

(22) Filed: Oct. 8, 1998

(51) Int. Cl.$^7$ ..................................................... H01L 21/44

(52) U.S. Cl. ..................... 438/612; 438/613; 438/614; 438/615; 438/616; 438/15; 228/245; 228/41; 239/135

(58) Field of Search ........................ 438/15–16, 612, 438/613–616; 228/244, 41, 246, 56.3, 245; 118/213; 29/879, 884; 239/135

(56) References Cited

U.S. PATENT DOCUMENTS

| | | |
|---|---|---|
| 3,716,907 | 2/1973 | Anderson . |
| 3,719,981 | 3/1973 | Steitz . |
| 4,074,342 | 2/1978 | Honn et al. . |
| 4,332,341 | 6/1982 | Minetti . |
| 4,462,534 | 7/1984 | Bitaillou et al. . |
| 4,604,644 | 8/1986 | Beckham et al. . |
| 4,688,939 | 8/1987 | Ray . |
| 4,783,722 | 11/1988 | Osaki et al. . |
| 4,788,767 | 12/1988 | Desai et al. . |
| 4,830,264 | 5/1989 | Bitaillou et al. . |
| 4,871,110 | 10/1989 | Fukasawa et al. . |
| 4,897,918 | 2/1990 | Osaka et al. . |
| 4,914,814 | 4/1990 | Behun et al. . |
| 4,932,883 | 6/1990 | Hsia et al. . |
| 5,058,178 | 10/1991 | Ray . |
| 5,060,844 | 10/1991 | Behun et al. . |
| 5,088,639 | 2/1992 | Gondotra et al. . |
| 5,109,601 | 5/1992 | McBride . |
| 5,118,027 | 6/1992 | Braun et al. . |
| 5,133,495 | 7/1992 | Angulas et al. . |
| 5,155,905 | 10/1992 | Miller, Jr. . |
| 5,162,257 | 11/1992 | Yung . |
| 5,203,075 | 4/1993 | Angulas et al. . |
| 5,219,117 | 6/1993 | Lin . |
| 5,255,839 | 10/1993 | da Costa Alves et al. . |
| 5,279,045 | 1/1994 | Odashima et al. . |
| 5,284,287 | 2/1994 | Wilson et al. . |
| 5,330,574 | 7/1994 | Nakagawa et al. . |
| 5,410,806 | 5/1995 | Schneider . |
| 5,431,332 | 7/1995 | Kirby et al. . |
| 5,445,313 | 8/1995 | Boyd et al. . |
| 5,467,913 | 11/1995 | Namekawa et al. . |
| 5,491,301 | 2/1996 | Akiba et al. . |
| 5,492,266 | 2/1996 | Hoebener et al. . |
| 5,506,385 | 4/1996 | Murakami et al. . |
| 5,574,801 | 11/1996 | Collet-Beillon . |
| 5,597,110 | 1/1997 | Melton et al. . |

(List continued on next page.)

OTHER PUBLICATIONS

Webster's Ninth New Collegiate Dicitionary, 1984 copywright by Merriam Webster Inc., p. 477.*

Primary Examiner—Matthew Smith
Assistant Examiner—B. V. Keshaven
(74) Attorney, Agent, or Firm—TraskBritt

(57) ABSTRACT

Apparatus and methods for placing conductive spheres on prefluxed bond pads of a substrate using a stencil plate with a pattern of through-holes positioned over the bond pads. Conductive spheres are placed in the through-holes by a moving feed mechanism and the spheres drop through the through-holes onto the bond pads. In one embodiment, the feed mechanism is a sphere hopper which crosses the entire though-hole pattern. In another embodiment, a shuttle plate fed spheres from a reservoir and reversibly moves about one-half of the pitch, moving from a non-discharge position to a discharge position.

10 Claims, 6 Drawing Sheets

U.S. PATENT DOCUMENTS

| | | |
|---|---|---|
| 5,607,099 | 3/1997 | Yeh et al. . |
| 5,615,823 | 4/1997 | Noda et al. . |
| 5,617,990 | 4/1997 | Thompson, Sr. . |
| 5,620,927 * | 4/1997 | Lee ......................................... 29/841 |
| 5,633,204 | 5/1997 | Tago et al. . |
| 5,637,832 | 6/1997 | Danner . |
| 5,643,831 | 7/1997 | Ochiai et al. . |
| 5,668,059 | 9/1997 | Christie et al. . |
| 5,669,970 | 9/1997 | Balog et al. . |
| 5,672,542 | 9/1997 | Schwiebert et al. . |
| 5,675,889 | 10/1997 | Acocella et al. . |
| 5,680,984 | 10/1997 | Sakemi . |
| 5,685,477 | 11/1997 | Mallik et al. . |
| 5,687,901 | 11/1997 | Hoshiba et al. . |
| 5,695,667 | 12/1997 | Eguchi et al. . |
| 5,704,535 | 1/1998 | Thompson, Sr. . |
| 5,796,590 * | 8/1998 | Klein ..................................... 361/774 |
| 5,918,792 * | 7/1999 | Stumpe et al. .......................... 228/41 |
| 5,930,889 * | 8/1999 | Klein ..................................... 29/840 |
| 5,977,512 * | 11/1999 | Azdasht et al. ................. 219/121.63 |
| 5,977,624 * | 11/1999 | Heo et al. ............................ 257/701 |
| 6,012,626 * | 1/2000 | Antao ..................................... 228/254 |

\* cited by examiner

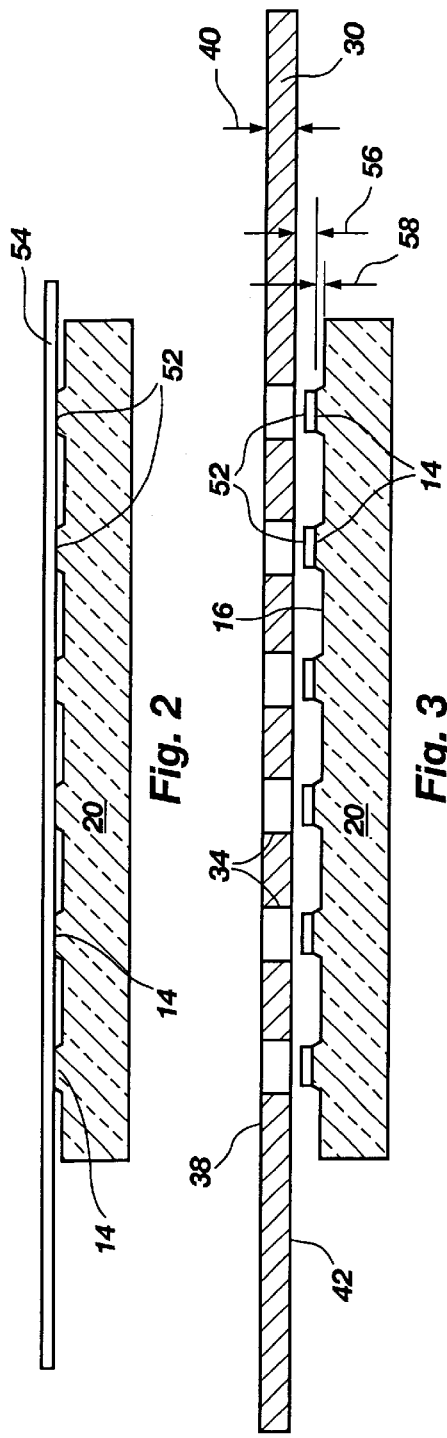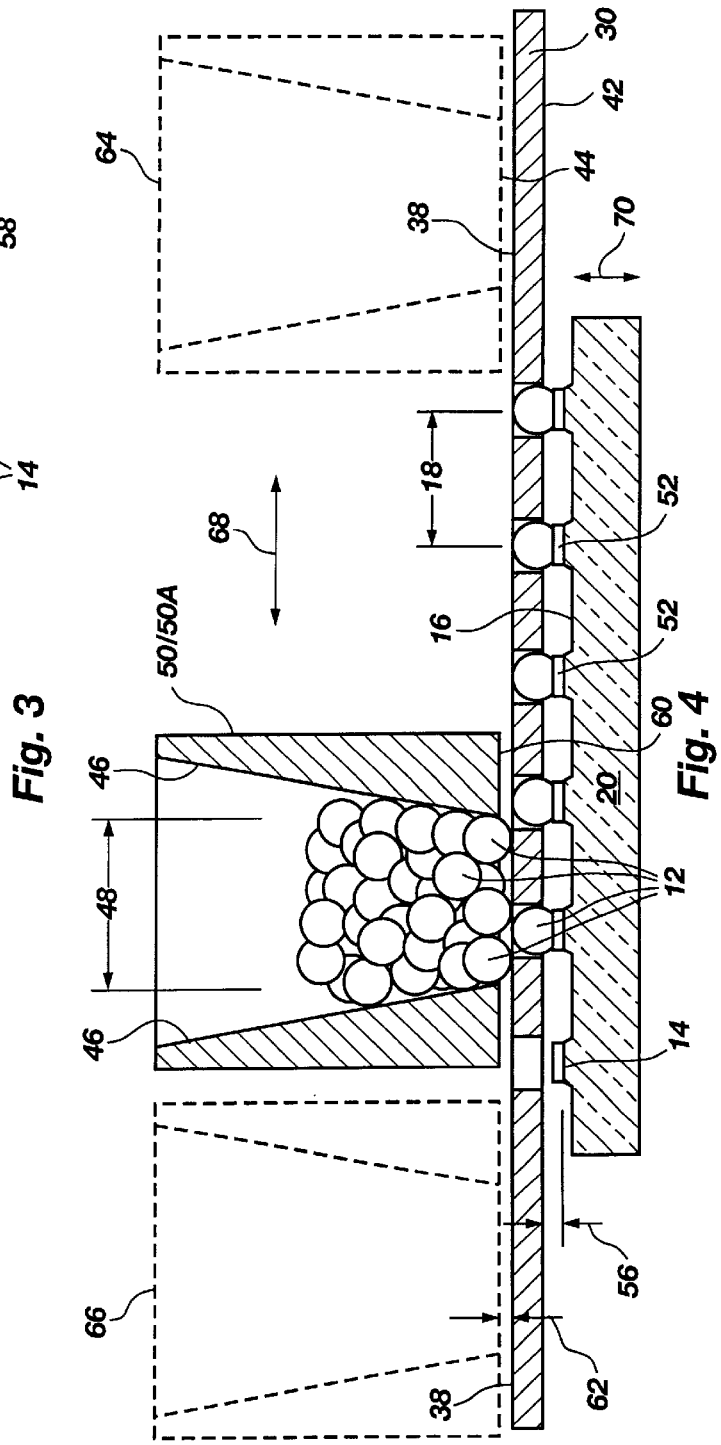
Fig. 2
Fig. 3
Fig. 4

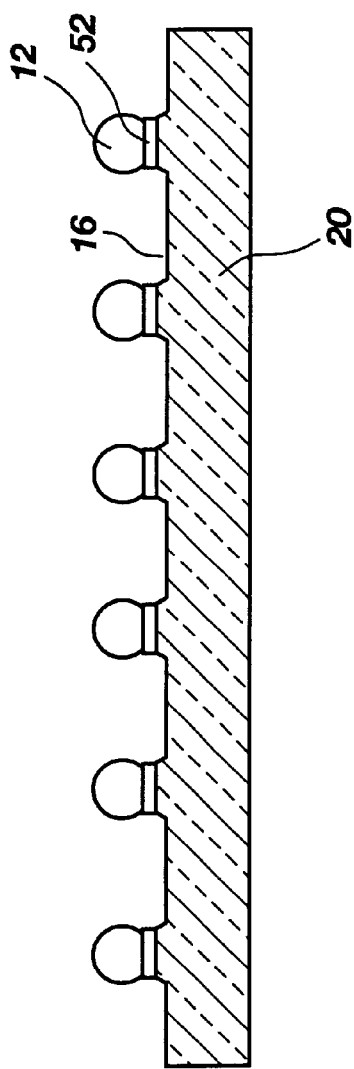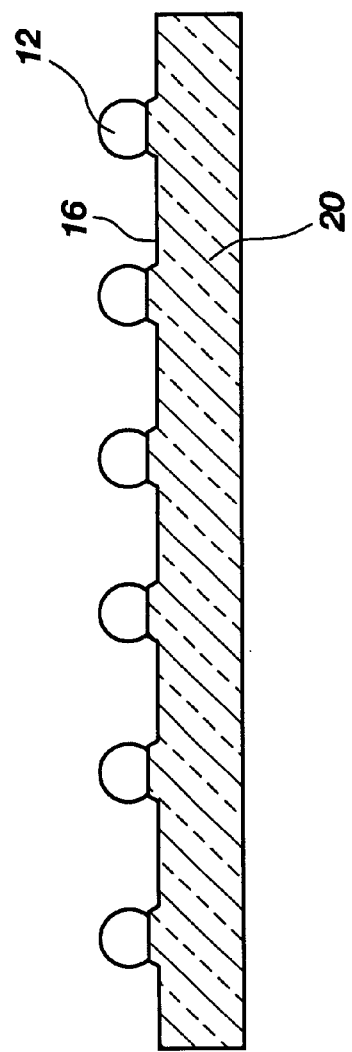

METHOD OF LOCATING CONDUCTIVE SPHERES UTILIZING SCREEN AND HOPPER OF SOLDER BALLS

BACKGROUND OF THE INVENTION

1. Field of the Invention

This invention relates generally to semiconductor device manufacturing. More particularly, the present invention is directed to methods and apparatus for handling solder balls in forming ball grid arrays (BGA's).

2. State of the Art

Integrated circuit semiconductor devices (IC's) are small electronic circuits formed on the surface of a wafer of semiconductor material such as silicon. The IC's are fabricated in plurality in wafer form and tested by a probe to determine electronic characteristics applicable to the intended use of the IC's. The wafer is then subdivided into discrete IC chips or semiconductor dice, and then further tested and assembled for customer use through various well-known individual IC die testing and packaging techniques, including lead frame packaging, Chip-On-Board (COB) packaging, and flip-chip packaging (FCP). Depending upon the semiconductor die and wafer sizes, each wafer is divided into a few dice or as many as several hundred or more than one thousand discrete die.

Interconnection of discrete semiconductor packages onto a substrate such as a printed circuit board (PCB) is often accomplished with solder preforms having generally spherical or other shape. In a process using a ball-grid-array (BGA), spherical solder balls are attached to prefluxed, metallized locations on a workpiece such as a circuit board or a semiconductor device. The workpiece is then heated to reflow the solder balls, and the solder balls become attached to the metallized locations during subsequent cooling. A semiconductor package or circuit board having a corresponding but reversed pattern of connection sites may then be aligned with the BGA and bonded to it by controlled heating in a reflow furnace.

The use of flip-chip technology with solder bumps has numerous advantages for interconnection, it being widely used in the electronics industry. Flip-chip design provides improved electrical performance for high frequency processor applications, such as mainframes, computer workstations, and personal computers having powerful processors. Ball-grid-array interconnections are of small size. In addition, easier thermal management and reduced susceptibility to EMI and RFI emissions are inherent in the use of BGA technology.

In addition, surface mount technology (SMT) using solder "bump" or ball interconnects eliminates the outer package leads level of interconnection, significantly reducing the cost.

Solder bumps may be formed on a workpiece by processes of evaporation, electroplating, stencil printing, and serial methods. Each of these processes has particular limitations. U.S. Pat. No. 5,672,542 of Schwiebert et al. is an example of a modified stencil printing process.

In U.S. Pat. No. 3,716,907 of Anderson, the use of germanium hemispheres as conductive contacts is disclosed. The germanium hemispheres are connected to the substrates with solder.

Relative to other types of interconnections, the use of solder preforms, in particular spherical or near-spherical balls, has proven to have significant advantages. One advantage is that while the solder balls are formed with ball-to-ball size differences, they may be easily classified by size prior to application to a workpiece. Thus, a uniform size of solder balls may be used within a ball-grid-array.

Various methods have been used for aligning, placing, retaining and fixing solder balls on an array of sites on a workpiece.

In U.S. Pat. No. 5,620,927 of Lee, a template with an array of through-holes is placed on the workpiece and solder balls are introduced into the holes by rolling the solder balls across the workpiece surface. The apparatus may be installed on a tilt table to encourage filling of all holes. In U.S. Pat. No. 4,871,110 of Fukasawa et al., a template having an array of holes is placed on a ball holder with a like array of smaller holes to which vacuum is applied and over which solder balls are rolled. After the array is filled with solder balls, the template and ball holder with balls are removed and the exposed ends of the balls attached to a substrate by e.g. reflow. The template and ball holder are then pulled from the substrate, leaving a ball-grid-array ready for attachment to another substrate or workpiece. A vacuum system is required, and there is no easy way to replace a solder ball onto a bond pad to which a ball did not become attached (missing ball).

As shown in U.S. Pat. No. 3,719,981, an array of solder balls is arranged on the tacky surface of a pressure sensitive (PS) tape for alignment through a template to solder bumps on a wafer. After thermal reflow, the template and tape are removed.

The use of a template for forming solder bumps or "balls" on a workpiece from flux and solder pieces is disclosed in U.S. Pat. 5,492,266 of Hoebener et al.

In U.S. Pat. No. 5,431,332 of Kirby et al., a template is placed over the bond pads of a substrate, solder balls are poured over the template, and an air knife "sweeps" the surface free of excess solder balls.

The use of a ball pick-up tool with an array of vacuum suction ball retainers to pull up balls from an underlying reservoir and place them on a substrate is disclosed in U.S. Pat. No. 5,088,639 of Gondotra et al., U.S. Pat. No. 5,284,287 of Wilson et al., U.S. Pat. No. 5,445,313 of Boyd et al., U.S. Pat. No. 5,467,913 of Nemekawa et al., U.S. Pat. No. 5,615,823 of Noda et al., U.S. Pat. No. 5,680,984 of Sakemi, U.S. Pat. No. 5,685,477 of Mallik et al., U.S. Pat. No. 5,687,901 of Hoshiba et al., and U.S. Pat. No. 5,695,667 of Eguchi et al. It is known in the art that shutting off the vacuum to release each ball onto the substrate is not always successful, and sometimes balls remain attached to the pick-up tool. Again, there is no easy way to replace a missing ball except with a single ball pickup tool.

U.S. Pat. No. 5,506,385 of Murakami et al. discloses the use of a single manipulable suction head for picking up a solder ball, moving it to a position above a fluxed contact pad on a substrate, and depositing it on the contact pad. Because of the high number of repetitive actions in separate placement of each ball, ball placement is time consuming.

U.S. Pat. No. 5,695,667 shows a single ball suction head which is used to place a solder ball on a contact pad which is missing a solder ball of a ball-grid-array.

The application of flux to solder balls held in a vacuum apparatus by dipping the balls into a flux reservoir is taught in U.S. Pat. No. 5,088,639 of Gondotra et al. and in U.S. Pat. No. 5,284,287 of Wilson et al.

The use of ultrasonic vibration to cause solder ball movement in the ball reservoir, and to remove excess solder balls from a vacuum pickup tool, is taught in U.S. Pat. No. 5,687,901 of Hoshiba et al.

BRIEF SUMMARY OF THE INVENTION

The invention comprises apparatus and methods for rapidly, accurately, and reliably placing an array of conductive spheres such as solder balls on conductive sites, e.g. bond pads, on a substrate. The substrate may be a circuit board of any composition, e.g. BT resin, or may be a silicon wafer or even a single semiconductor die such as an "IC chip". The conductive sites on the substrate may comprise bond pads which include those which project from the substrate and those which are recessed into the substrate surface. Projecting bond pads require a pre-application of flux or other sticky substance by which the spheres cling to the bond pads. Use of flux or sticky substance may not necessarily be required with recessed bond pads.

The apparatus includes a stencil plate or screen overlying the substrate, wherein the stencil plate is parallel to and slightly spaced from the substrate. The stencil plate has an array of through-holes corresponding to a desired placement pattern of conductive spheres on the substrate. The invention also includes ball supply apparatus for providing conductive spheres to the stencil plate, wherein all through-holes in the stencil plate are filled with one, and only one, sphere. Spheres placed into the through-holes of the stencil plate drop by gravity to the substrate for retention by pre-applied flux or by depressed bond pads. Each through-hole is slightly larger than a sphere and constrains a sphere on the substrate until the substrate and stencil plate are further separated e.g. for solder reflow. The stencil plate thickness and proximity to the substrate prevent more than one ball from entering each through-hole of the stencil plate.

A first embodiment of a ball supplying apparatus is a sphere-retaining hopper with a lower opening through which spheres may drop into through-holes of the stencil plate and thence onto the substrate surface. The hopper is closely spaced from the stencil plate to maintain control over all the spheres therein. Sphere placement is accomplished by horizontal movement of the hopper across the through-hole pattern of the stencil plate, filling each through-hole with one and only one sphere. As the hopper moves, only the spheres dropping into the through-holes, one to a through-hole, can escape from the hopper. The numbers of spheres passing over each through-hole ensure that each hole is filled, but a higher degree of assurance can be obtained by making several passes.

In a second embodiment, a sphere supply apparatus includes a shuttle plate with the same through-hole pattern as the stencil plate. The shuttle plate closely overlies the stencil plate and is reversibly movable between a first position wherein its through-hole pattern is aligned with the pattern of the stencil plate and a second position wherein the through-hole patterns are non-aligned. In the first position, spheres may drop from the shuttle plate through-holes into the stencil plate through-holes. In the latter position, spheres are prevented from entering the through-holes of the stencil plate. The through-holes of the shuttle plate may be fed from an overlying open bottom reservoir, which may be fixed to the shuttle plate or fixed in position. The linear movement of the shuttle plate is less than the inter-sphere distance, i.e. pitch and is generally equal to about one-half of the pitch.

BRIEF DESCRIPTION OF THE DRAWINGS

The following drawings illustrate various embodiments of the invention, not necessarily drawn to scale, wherein:

FIG. 2 is a sectional side view of a substrate and exemplary screen for applying flux to the bond pads in a step of a method of the invention for placing conductive spheres on a substrate;

FIG. 3 is a sectional side view of a stencil fixture shown in overlying relationship to a prefluxed substrate ready to receive conductive spheres in a step of a method of the invention for placing conductive spheres on a substrate;

FIG. 4 is a sectional side view of a sphere placement apparatus of the invention showing spheres placed on the bond pads of a substrate, as taken along line 4—4 of FIG. 1;

FIG. 5 is a sectional side view of a substrate having conductive spheres placed the bond pads of the substrate in accordance with a sphere placement method of the invention;

FIG. 6 is a sectional side view of a substrate having conductive spheres placed on the bond pads of the substrate and reflowed in accordance with a method of the invention;

DESCRIPTION OF THE ILLUSTRATED EMBODIMENTS

Figure 1:
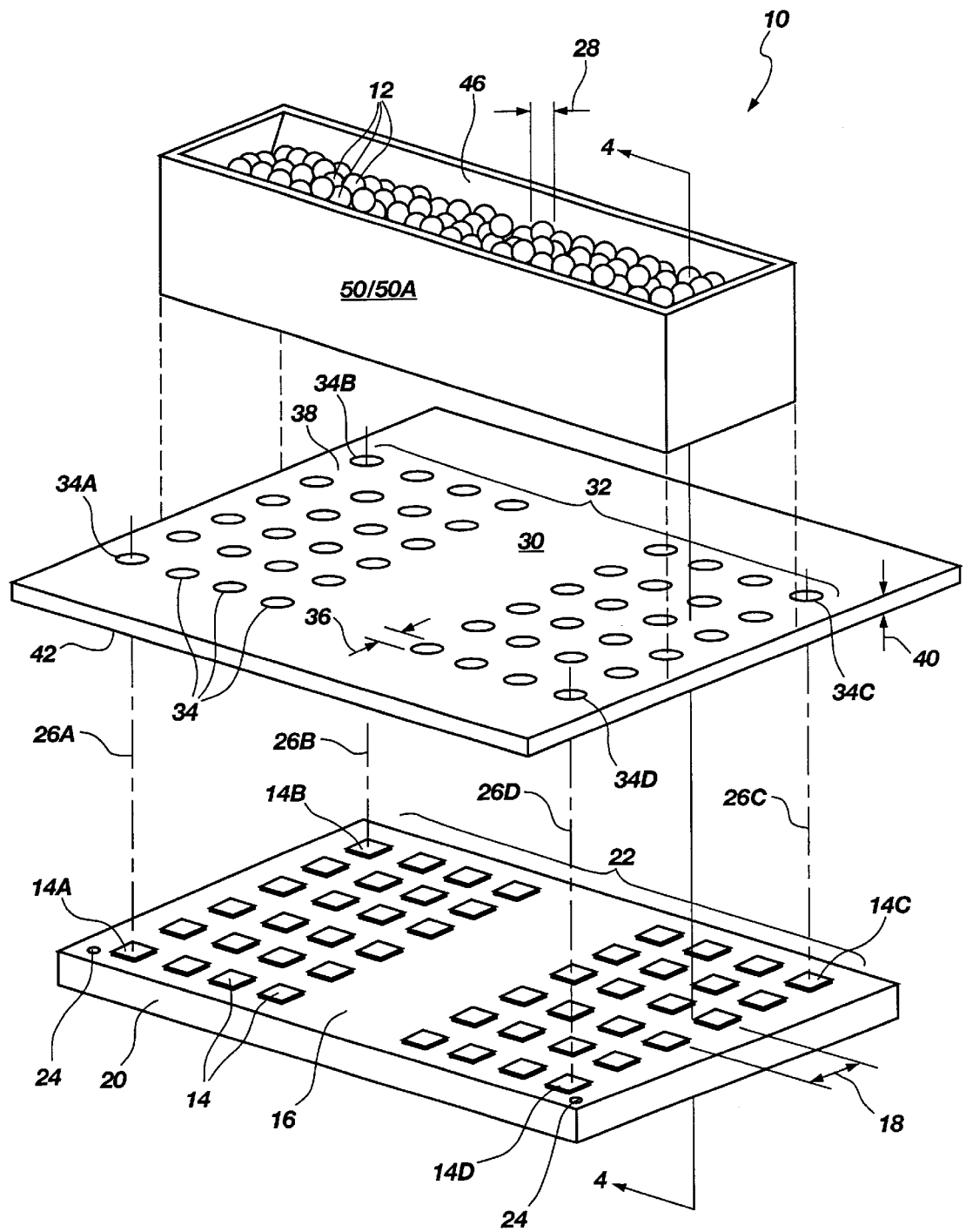
FIG. 1 is a perspective exploded view of exemplary apparatus of the invention for placing conductive spheres on a substrate.

The invention comprises an improved method and apparatus for placing a plurality of conductive spheres 12 such as preformed solder balls or germanium balls on conductive sites 14 on a surface 16 of a substrate 20. The term "substrate" is used in a broad generic sense herein to include any semiconductor device including a wafer or a packaged or unpackaged bare die, as well as traditional substrates including circuitized boards such as printed circuit boards (PCB's). The method of the invention may be applied to the placement of conductive spheres 12 on any conductive site, 14, whether the site e.g. bond pad projects from the substrate 20 or is recessed therein. The terms "conductive site" and "bond pad" are used interchangeably herein to denote any site 14 at which a conductive sphere 12 is to be placed.

One embodiment of the sphere placement apparatus 10 and the placement method used therewith are illustrated in drawing FIGS. 1 through 4.

As depicted in drawing FIG. 1, a placement apparatus 10 for placing a plurality of conductive spheres 12 on a substrate 20 comprises a stencil plate or screen 30 and a sphere supply apparatus 50/50A. The substrate 20 is shown with a pattern 22 of bond pads 14 with an interpad pitch 18, wherein the pattern 22 in this example includes all of the bond pads. The substrate 20 is shown with exemplary registry markers 24 by which the stencil plate 30 and substrate may be accurately aligned to each other. The various components of the invention may be aligned using a mechanical or pattern recognition alignment, or any other type of accurate alignment apparatus as known in the art.

A stencil plate 30 of the sphere placement apparatus 10 is a planar plate with upper surface 38 and lower surface 42. An array of through-holes 34 is arranged in a through-hole pattern 32 which corresponds to bond pad pattern 22 of the substrate 20. Through-holes 34 have a diameter 36 which is slightly larger than the mean diameter 28 of the conductive spheres 12, so that the spheres may easily pass through, yet be closely constrained in lateral movement.

The stencil plate 30 has a thickness 40 which is configured and positioned for holding conductive spheres 12 on bond pads 14, such that a sphere supply apparatus 50 moving across the stencil plate does not intercept the placed spheres, while preventing more than one sphere from entering each through-hole 34.

The stencil plate 30 is configured to have its through-hole pattern 32 aligned with the bond pad pattern 22. Thus, through-holes 34A, 34B, 34C and 34D are shown vertically aligned by centerlines 26A, 26B, 26C and 26D with bond pads 14A, 14B, 14C and 14D, respectively.

Each stencil plate 30 is configured to operate with a substrate 20 having a particular bond pad pattern 22, a particular sphere diameter 28, and a given range of bond pad projection height 58 (FIG. 3).

Figure 7:
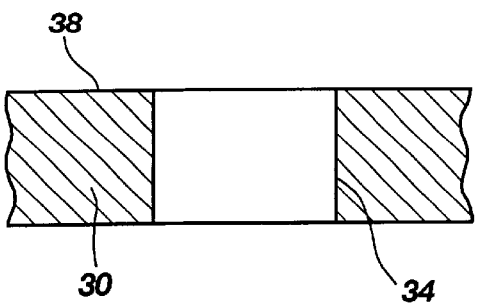
FIG. 7 is a partial sectional side view of a stencil fixture of the invention.
Figure 8:
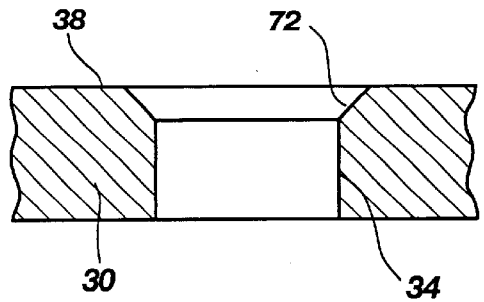
FIG. 8 is a partial sectional side view of another embodiment of a stencil fixture of the invention.

Referring to drawing FIG. 7, illustrated is a straight through-hole 34 of a stencil plate 30. As depicted in drawing FIG. 8, the through-hole 34 may have a beveled upper edge 72 which enhances movement of spheres 12 into the through-hole.

The sphere placement apparatus 10 includes a sphere supply apparatus 50 which in this embodiment is a hopper 50A having a lower opening 44 (FIG. 4) by which conductive spheres 12 may drop into through-holes 34 of the stencil plate 30 as the hopper is moved across the upper surface 38 of the stencil plate. The hopper 50A has inner walls 46 which contain and feed spheres 12 to the stencil plate 30.

The lower opening 44 has a width 48 equivalent to about 2 to about 10 sphere diameters 28. Thus, for solder balls 12 having a diameter 28 of 1.0 mm, the lower opening may have a width 48 of about 0.2 cm. to about 1.0 cm.

As shown in drawing FIG. 4, the hopper 50A has a lower surface 60 which is spaced from the upper surface 38 of the stencil plate 30 by a short distance 62. Distance 62 is less than one-half (and preferably less than one-third) of the ball diameter 28, and the stencil plate 30 and hopper 50A may even be in contact. The hopper 50A is controlled to reversibly move across pattern 32 in direction 68 from a first position 64 beyond one side of the pattern 32 to a second position 66 beyond the other side of the pattern, dropping conductive spheres 12 into each through hole 34, and thereby onto each bond pad 14 directly below.

The substrate 20, stencil plate 30, and hopper 50A are each manipulated in robotic action to maintain the desired clearances and alignments, and to move the hopper 50A between positions 64 and 66.

Figure 9:
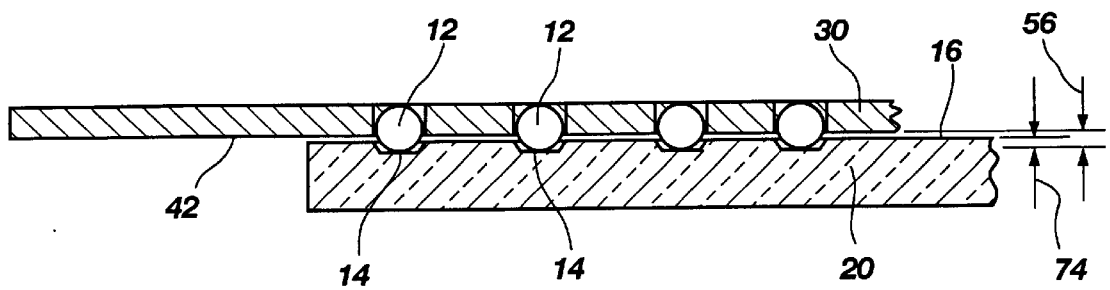
FIG. 9 is a partial sectional side view of a substrate with recessed bond pads having conductive spheres placed thereon, in accordance with a sphere placement method of the invention.

In the drawings of FIGS. 1–6, the bond pads 14 of substrate 20 are pictured as projecting from the substrate. The sphere placement apparatus may be used for placing spheres onto recessed bond pads 14, as depicted in drawing FIG. 9. Depending on the sphere diameter 28 and the recess depth 74 of the bond pads 14, the stencil plate thickness 40 may need to be adjusted to achieve a sufficient plate-to-pad gap 56.

Figure 10:
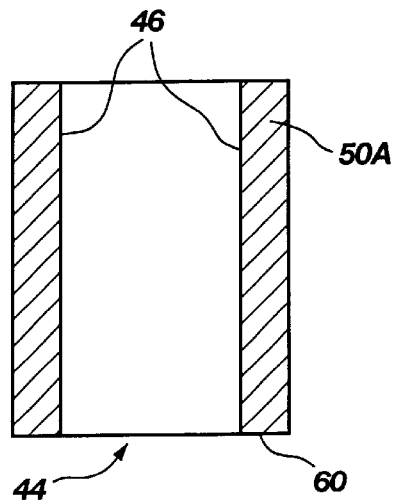
FIG. 10 is a cross-sectional end view of another embodiment of a hopper of the invention, as taken along line 10—10 of FIG. 1.

The hopper 50A may have inside wall surfaces 46 which are sloping, as in FIG. 4, or parallel, as in drawing FIG. 10.

Figure 11:
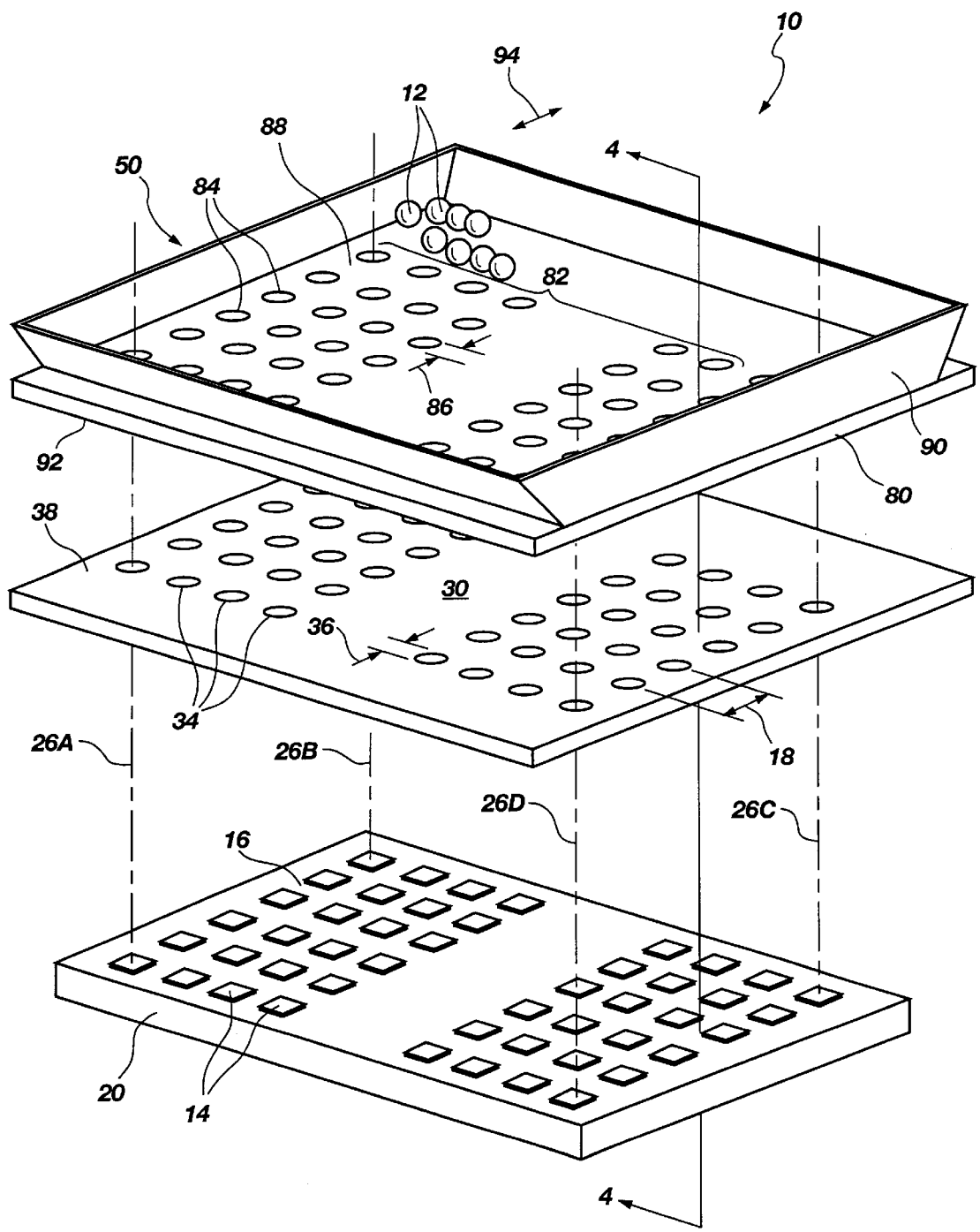
FIG. 11 is a perspective exploded view of another embodiment of the invention for placing conductive spheres on a substrate.
Figure 12:
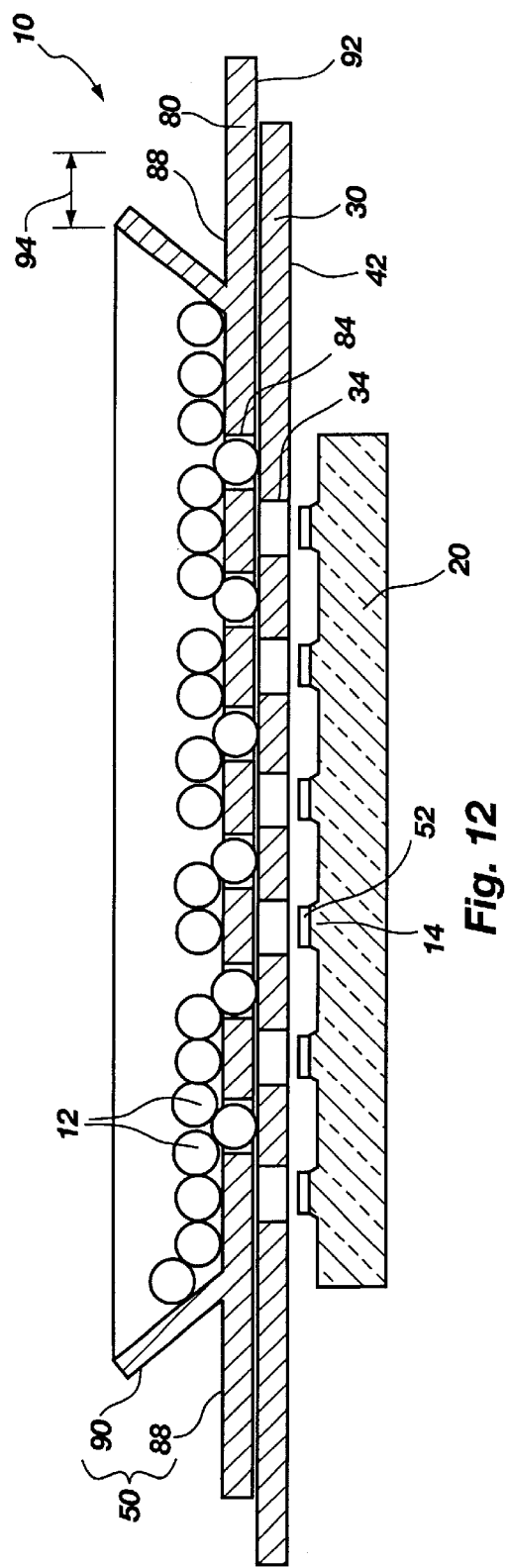
FIG. 12 is a sectional side view of another embodiment of an apparatus for placing conductive spheres on a substrate, shown in a preplacement step in a method of the invention.
Figure 13:
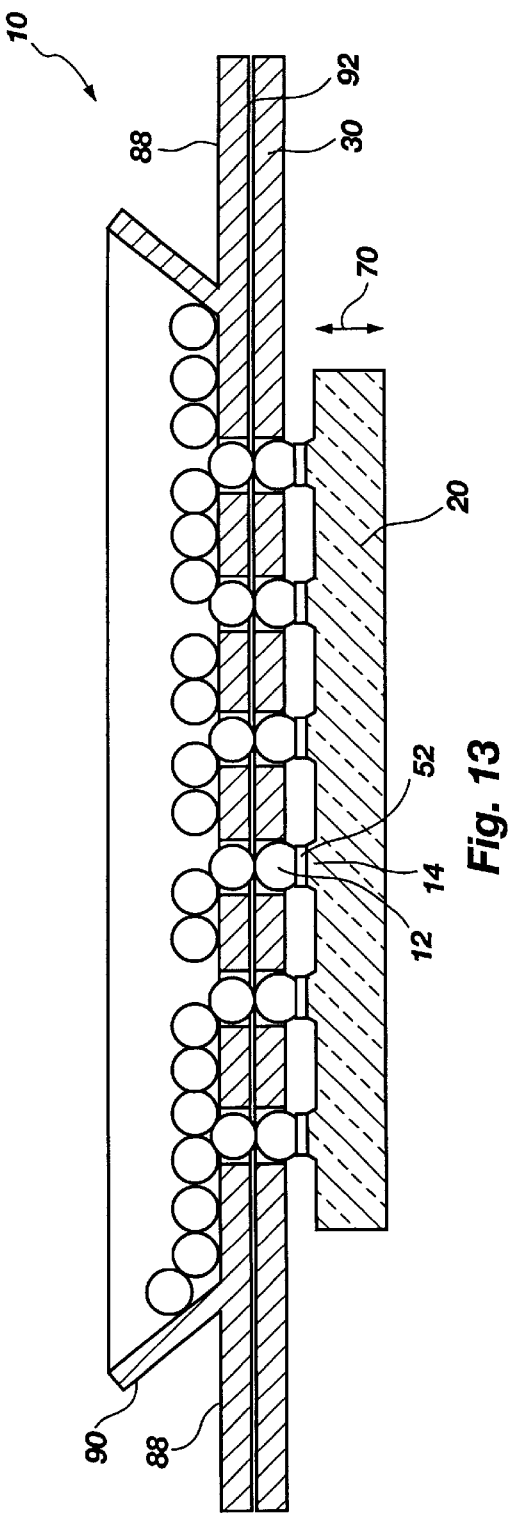
FIG. 13 is a sectional side view of a sphere placement step in a method of the invention.

Another embodiment of the sphere placement apparatus 10 is shown in drawing FIGS. 11–13. The substrate 20 and stencil plate 30 are shown as being identical to those already described above. However, the sphere supply apparatus 50 comprises a shuttle plate 80 which underlies a sphere reservoir 90. Reservoir 90 may be attached to the shuttle plate 80, or may comprise a separate structure. Shuttle plate 80 has an upper surface 88 and a parallel lower surface 92, with a third pattern 82 of through-holes 84. The third pattern 82 is substantially the same as through-hole pattern 32, although through-holes 84 may be of somewhat greater diameter 86 than the diameter 36 of through-holes 34. The shuttle plate 80 and sphere reservoir 90 may be configured to reversibly move a short distance in direction 94, i.e. roughly one-half of the pitch 18. Thus, the shuttle plate 80 moves from a position where its through-hole pattern 82 is non-aligned with the stencil plate pattern 32 (see FIG. 12) to a position where it is aligned therewith (see FIG. 13) for dropping the conductive spheres 12 into through-holes 34 and thus onto the bond pads 14.

In another embodiment of the shuttle plate 80 and sphere reservoir 90, they are not connected. The reservoir 90 may be kept in one position while the shuttle plate 80 moves past it for filling the through-holes 84.

Turning now to the method of using apparatus 10 for placing conductive spheres 12 on a substrate 20, we examine drawing FIGS. 2 through 6 in sequence.

As shown in drawing FIG. 2, a step in the method of the invention involves the application of a layer 52 of flux or other sticky substance to the bond pads 14 of the substrate 20. In drawing FIG. 2, illustrated is an exemplary silk screen 54 by which the layer 52 is formed, as known in the art. Other methods for prefluxing the bond pads 14 are also well-known and may be used. Any method may be used which provides a sticky layer 52 to which a conductive sphere 12 will adhere. The use of flux, of course, enhances bonding of solder to a bond pad during reflow.

After a layer 52 is formed on the bond pads 14, the lower surface 42 of a stencil plate 30 and the upper surface 16 of a substrate 20 are aligned to provide a desired plate-to-pad gap 56 (see FIG. 3).

The hopper 50A, having conductive spheres 12 therein, is moved in direction 68 across the through-hole pattern 32 of the stencil plate 30, whereby spheres are dropped into each through-hole 34 to become adhered to the bond pads 14 as shown in FIG. 4.

At this point in the process, the stencil plate 30 may be tested, either visually or by other methods known in the art, to ensure that all through-holes 34 are filled. If any through-holes 34 are unfilled, the hopper movement may be repeated.

Upon filling of all through-holes 34 with spheres 12, the substrate 20 and/or the stencil plate 30 with hopper 50A are moved in direction 70, separating the substrate as shown in drawing FIG. 5 for further manufacturing steps. The next step is typically one of heating the substrate 20 and spheres 12 to cause a reflow of the solder spheres, resulting in spheres fixed to the bond pads 14 as shown in drawing FIG. 6. Where the conductive spheres are not solder, but comprise a metal such as germanium, the sphere placing method may begin with solder being placed on each bond pad 14, fluxing of the solder surface, and then placement of the spheres 12.

The placement method for the embodiment of drawing FIGS. 11–13 is similar to that of drawing FIGS. 1–4. The steps of pre-applying a layer 52 of flux or sticky material to the bond pads 14, and aligning of the stencil plate 30 with the substrate 20 are the same or similar. Once the prefluxed substrate 20 is properly installed in the apparatus, the shuttle plate 80 and sphere reservoir 90 are moved from a non-aligned position to an aligned position, whereby conductive spheres 12 fill the through-holes 84 of the shuttle plate and, upon reaching the aligned position (FIG. 13), are dropped into the through-holes 34 of the stencil plate 30 and onto the prefluxed bond pads 14. The substrate 20 may be then separated from the stencil plate 30 and the spheres 12 fixed by reflow to the substrate.

The methods described herein present many advantages to the BGA formation process, including higher reliability, lower cost, reduced ball wastage, etc. The apparatus and methods are relatively simple, yet provide a great deal of flexibility in substrate type, sphere size, sphere composition, etc. Non-filling of a through-hole of the stencil plate is easily cured by moving the sphere supply apparatus through another cycle. There is no need for using a single-head ball picker to place a single ball as noted in the prior art.

This invention may be embodied in several forms without departing from the spirit of essential characteristics of the invention. The embodiments as described herein are therefore intended to be only illustrative and not restrictive, and the scope of the invention is defined by the appended claims rather than the preceding description, and all variations that fall within the metes and bounds of the subject matter claimed, or are equivalent thereto, are therefore intended to be embraced by the following claims:

What is claimed is:

1. A method for placing an array of conductive spheres on prefluxed bond pads of a substrate, said method comprising:

providing a substrate having a surface with a first pattern of bond pads;

providing a stencil plate having upper and lower surfaces with a second pattern of through-holes therethrough, said second pattern of through-holes corresponding to said first pattern of bond pads;

providing a hopper with an open top and configured to receive, hold and dispense conductive spheres as said hopper is closely moved across said upper surface of said stencil plate;

placing said stencil plate over said substrate to align said patterns; and moving said hopper across the upper surface of said stencil plate to a position beyond said pattern of through-holes to drop conductive spheres through said through-holes onto said bond pads.

2. The method of claim 1, further comprising:

determining if each through-hole contains a conductive sphere; and repeating the moving of said hopper if a through-hole is not filled.

3. The method of claim 1, further comprising:

removing said substrate from adjacent said stencil plate; and subjecting said substrate and spheres to a solder reflow process.

4. The method of claim 1, wherein the through-holes of said stencil plate have beveled upper edges.

5. The method of claim 1, wherein the side walls of the hopper taper in toward the lower opening.

6. A method for placing an array of conductive spheres on prefluxed bond pads of a substrate, said method comprising:

providing a substrate having a surface with a first pattern of bond pads;

providing a stencil plate having upper and lower surfaces with a second pattern of through-holes therethrough, said second pattern of through-holes corresponding to said first pattern of bond pads;

providing a shuttle plate having upper and lower surfaces with a third pattern of through-holes therethrough, said third pattern of through-holes corresponding to said second pattern of through-holes;

providing a sphere reservoir adjacent the upper surface of said shuttle plate with an open top and configured to receive, hold and dispense conductive spheres into the third pattern of through-holes of said shuttle plate;

placing said stencil plate over said substrate to align said first and second patterns; and moving said shuttle plate across the upper surface of said stencil plate between a position aligned with said second pattern of through-holes and a position non-aligned with said second pattern beyond said second pattern of through-holes to drop conductive spheres through said second and third pattern of through-holes onto said bond pads.

7. The method of claim 6, further comprising:

determining if each through-hole contains a conductive sphere; and repeating the moving of said shuttle plate if a through-hole is not filled.

8. The method of claim 6, further comprising:

removing said substrate from adjacent said stencil plate; and subjecting said substrate and spheres to a solder reflow process.

9. The method of claim 6, wherein the through-holes of said stencil plate have beveled upper edges.

10. The method of claim 6, wherein the inner edges of the sphere reservoir are oriented so as to extend from the shuttle plate upward at an obtuse angle.

* * * * *

UNITED STATES PATENT AND TRADEMARK OFFICE
CERTIFICATE OF CORRECTION

PATENT NO. : 6,268,275 B1
APPLICATION NO. : 09/168621
DATED : July 31, 2001
INVENTOR(S) : Chad A. Cobbley, Michael B. Ball and Marjorie L. Waddel It is certified that error appears in the above-identified patent and that said Letters Patent is hereby corrected as shown below:

In the specification:

| | | |
|---|---|---|
| COLUMN 1, | LINE 10, | change "(BGA's)." to --(BGAs).-- |
| COLUMN 1, | LINE 13, | change "(IC's)" to --(ICs)-- |
| COLUMN 1, | LINE 15, | change "IC's" to --ICs-- |
| COLUMN 1, | LINE 18, | change "IC's." to --ICs.-- |
| COLUMN 1, | LINES 29-30, | change "generally spherical" to --generally a spherical-- |
| COLUMN 3, | LINE 40, | change "one and only one" to --one, and only one,-- |
| COLUMN 3, | LINE 60, | change "pitch and" to --pitch, and-- |
| COLUMN 4, | LINE 13, | change "place the" to --placed on the-- |
| COLUMN 4, | LINE 45, | change "spheres 12 such" to --spheres 12, such-- |
| COLUMN 4, | LINE 46, | change "germanium balls on" to --germanium balls, on-- |
| COLUMN 4, | LINE 52, | change "(PCB's)." to --(PCBs).-- |
| COLUMN 4, | LINE 54, | change "site e.g. bond pad" to --site, e.g., a bond pad,-- |
| COLUMN 4, | LINE 66, | change "of bond pads" to --of conductive sites or bond pads-- |
| COLUMN 4, | LINE 67, | change "pattern 22 in this example" to --pattern 22, in this example,-- |
| COLUMN 5, | LINE 34, | change "spheres 12" to --conductive spheres 12-- |
| COLUMN 5, | LINE 42, | change "spheres 12" to --conductive Spheres 12-- |
| COLUMN 5, | LINE 44, | change "2 to about 10" to --two (2) to about ten (10)-- |
| COLUMN 5, | LINE 44, | change "solder balls 12" to --conductive spheres 12-- |
| COLUMN 5, | LINE 54, | change "pattern 32" to --through-hole pattern 32-- |
| COLUMN 5, | LINE 55, | change "pattern 32" to --through-hole pattern 32-- |
| COLUMN 5, | LINE 57, | change "through hole" to --through-hole-- |
| COLUMN 5, | LINE 65, | change "apparatus may" to --apparatus 10 may-- |

UNITED STATES PATENT AND TRADEMARK OFFICE
CERTIFICATE OF CORRECTION

PATENT NO. : 6,268,275 B1
APPLICATION NO. : 09/168621
DATED : July 31, 2001
INVENTOR(S) : Chad A. Cobbley, Michael B. Ball and Marjorie L. Waddel It is certified that error appears in the above-identified patent and that said Letters Patent is hereby corrected as shown below:

In the specification (cont.):

| | | |
|---|---|---|
| COLUMN 6, | LINE 20, | change "pitch 18." to --interpad pitch 18.-- |
| COLUMN 6, | LINE 22, | change "stencil plate pattern 32" to --through-hole pattern 32-- |
| COLUMN 6, | LINE 57, | change "spheres 12," to --conductive spheres 12,-- |
| COLUMN 6, | LINES 61-62, | change "spheres 12" to --conductive spheres 12-- |
| COLUMN 6, | LINE 67, | change "spheres 12." to --conductive spheres 12.-- |
| COLUMN 7, | LINE 13, | change "spheres 12" to --conductive spheres 12-- |

In the claims:

| | | | |
|---|---|---|---|
| CLAIM 1, | COLUMN 7, | LINE 50, | change "said pattern" to --said second pattern-- |
| CLAIM 1, | COLUMN 7, | LINES 51-52, | change "said through-holes" to --said second pattern of through-holes-- |
| CLAIM 1, | COLUMN 7, | LINE 52, | change `said bond pads." to --said first pattern of bond pads.-- |
| CLAIM 3, | COLUMN 8, | LINE 6, | change "spheres" to --said conductive spheres-- |
| CLAIM 4, | COLUMN 8, | LINE 8, | change "the through-holes" to --the second pattern of through-holes-- |
| CLAIM 5, | COLUMN 8, | LINE 11, | change "the lower opening." to --a lower opening.-- |
| CLAIM 6, | COLUMN 8, | LINE 38, | change "said bond pads." to --said first pattern of bond pads.-- |

UNITED STATES PATENT AND TRADEMARK OFFICE
CERTIFICATE OF CORRECTION

PATENT NO. : 6,268,275 B1
APPLICATION NO. : 09/168621
DATED : July 31, 2001
INVENTOR(S) : Chad A. Cobbley, Michael B. Ball and Marjorie L. Waddel It is certified that error appears in the above-identified patent and that said Letters Patent is hereby corrected as shown below:

In the claims (continued):
CLAIM 8,  COLUMN 8,  LINE 47,   change "spheres" to --said conductive spheres--
CLAIM 9,  COLUMN 8,  LINE 49,   change "the through-holes" to --the second pattern of through-holes--
CLAIM 10, COLUMN 8,  LINE 51,   after "wherein" and before "inner" delete "the"

Signed and Sealed this

Twenty-fifth Day of December, 2007

JON W. DUDAS
*Director of the United States Patent and Trademark Office*